(12) United States Patent
Mei

(10) Patent No.: US 11,233,212 B2
(45) Date of Patent: Jan. 25, 2022

(54) POLYMER, QUANTUM DOTS FILM LAYER AND PREPARATION METHOD THEREOF

(71) Applicant: BOE TECHNOLOGY GROUP CO., LTD., Beijing (CN)

(72) Inventor: Wenhai Mei, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 505 days.

(21) Appl. No.: 16/169,567

(22) Filed: Oct. 24, 2018

(65) Prior Publication Data

US 2019/0207137 A1  Jul. 4, 2019

(30) Foreign Application Priority Data

Jan. 3, 2018 (CN) .......................... 201810005394.8

(51) Int. Cl.
| | |
|---|---|
| *H01L 51/50* | (2006.01) |
| *H01L 51/00* | (2006.01) |
| *H01L 51/56* | (2006.01) |
| *C08G 75/14* | (2006.01) |
| *C09K 11/00* | (2006.01) |
| *C09K 11/02* | (2006.01) |

(Continued)

(52) U.S. Cl.
CPC ............ *H01L 51/502* (2013.01); *C08G 75/14* (2013.01); *C09K 11/025* (2013.01); *H01L 51/0007* (2013.01); *H01L 51/0028* (2013.01); *H01L 51/0035* (2013.01); *H01L 51/56* (2013.01); *B82Y 20/00* (2013.01); *B82Y 40/00* (2013.01)

(58) Field of Classification Search
USPC ................................ 528/211, 380, 384, 401
See application file for complete search history.

(56) References Cited

U.S. PATENT DOCUMENTS

| | | | | |
|---|---|---|---|---|
| 7,651,790 | B2 * | 1/2010 | Lee ...................... | H01L 51/5016 428/690 |
| 8,283,002 | B2 * | 10/2012 | Brown ................ | H01L 51/0035 428/1.4 |
| 2015/0028262 | A1 | 1/2015 | Griffiths | |

FOREIGN PATENT DOCUMENTS

| | | |
|---|---|---|
| CN | 1930921 A | 3/2007 |
| CN | 103525406 A | 1/2014 |
| CN | 103168062 B | 4/2015 |

(Continued)

OTHER PUBLICATIONS

First Office Action for Chinese Patent Application No. 201810005394.8 dated Jan. 13, 2020.

*Primary Examiner* — Fred M Teskin
(74) *Attorney, Agent, or Firm* — Calfee, Halter & Griswold LLP

(57) ABSTRACT

The present disclosure provides a polymer, a quantum dots film layer and a preparation method thereof. The polymer includes a plurality of polymerized units, and each of the polymerized units includes a hydrophobic structure and a carrier transport structure. The hydrophobic structure is linked to the carrier transport structure via a bridge bond containing a functional atom, and the hydrophobic structure is provided with a first ligand. When the polymerized unit is broken at the bridge bond, a hydrophobic monomer containing the first ligand and a carrier transport monomer containing a second ligand are generated. The second ligand includes the functional atom, and the second ligand is stronger than the first ligand in coordination activity.

20 Claims, 4 Drawing Sheets

(51) Int. Cl.
    *B82Y 40/00*     (2011.01)
    *B82Y 20/00*     (2011.01)

(56) References Cited

FOREIGN PATENT DOCUMENTS

| | | |
|---|---|---|
| CN | 104487097 A | 4/2015 |
| CN | 106083573 A | 11/2016 |
| CN | 106085417 A | 11/2016 |
| CN | 107325276 A | 11/2017 |
| EP | 1837928 A1 | 9/2007 |
| WO | 0220179 A2 | 3/2002 |

* cited by examiner

POLYMER, QUANTUM DOTS FILM LAYER AND PREPARATION METHOD THEREOF

CROSS-REFERENCE

This application is based upon and claims priority to Chinese Patent Application No. 201810005394.8, filed on Jan. 3, 2018, the entire contents thereof are incorporated herein by reference.

TECHNICAL FIELD

The present disclosure relates to the field of display technologies, and more particularly, to a polymer, a quantum dots film layer and a preparation method thereof.

BACKGROUND

The quantum dots light emitting diode (QLED) display is a new-type display technology developed on the basis of the organic light emitting diode (OLED) display. The difference between the QLED and the OLED lies in that a light-emitting layer in the QLED is a quantum dots layer, and the principle thereof is that electrons/holes are injected into the quantum dots layer through an electron/hole transport layer, such that the electrons and the holes are recombined to emit light in the quantum dots layer. Compared with the OLED, the QLED is narrow in luminescent peak, high in color saturation, and wide in color gamut, etc.

In the process of fabricating an existing QLED display device, typically a long-chain oily ligand and a quantum dot particle are employed to form quantum dots, and adding the long-chain oily ligand is advantageous to stability of the quantum dots in a synthesis system. However, the long-chain oily ligand may have a negative effect on subsequent application of the quantum dots in various aspects. For example, insulating properties of the long-chain oily ligand hinder the carrier transport performance, and thus the display performance of the QLED display device is reduced.

SUMMARY

The present disclosure relates to a polymer, a quantum dots film layer and a preparation method thereof.

In one aspect, there is provided a polymer, which includes a plurality of polymerized units. Each of the polymerized units includes a hydrophobic structure and a carrier transport structure. The hydrophobic structure is linked to the carrier transport structure via a bridge bond containing a functional atom. The hydrophobic structure is provided with a first ligand. When the polymerized unit is broken at the bridge bond, a hydrophobic monomer containing the first ligand and a carrier transport monomer containing a second ligand are generated. The second ligand includes the functional atom, and the second ligand is stronger than the first ligand in coordination activity.

In some embodiments, the functional atom is a sulfur atom. The first ligand is an amino ligand containing an amino group, and the second ligand is a mercapto ligand containing a mercapto group.

In some embodiments, the amino ligand is a primary amine based ligand, a secondary amine based ligand, or a tertiary amine based ligand.

In some embodiments, the bridge bond containing a functional atom is a disulphide ether bond, a thioether bond, or a thioester bond.

In some embodiments, the hydrophobic structure is a polyfluorinated aromatic structure.

In some embodiments, the polyfluorinated aromatic structure is a polyfluorobenzene structure, a polyfluorobiphenyl structure, or a hexafluorobiphenol A structure with a carbon position substituted.

In some embodiments, the carrier transport structure is a triphenylamine based structure, a carbazole based structure, or a thiophene based structure.

In another aspect, there is further provided a method for preparing the above polymer, which includes:

preparing a carrier transport unit and a hydrophobic unit; and reacting the hydrophobic unit with the carrier transport unit to generate the polymer.

The polymer includes a plurality of polymerized units. Each of the polymerized units includes a hydrophobic structure and a carrier transport structure. The hydrophobic structure is linked to the carrier transport structure via a bridge bond containing a functional atom. The hydrophobic structure is provided with a first ligand. When the polymerized unit is broken at the bridge bond, a hydrophobic monomer containing the first ligand and a carrier transport monomer containing a second ligand are generated. The second ligand includes the functional atom, and the second ligand is stronger than the first ligand in coordination activity.

In some embodiments, the preparing a carrier transport unit includes:

substituting a polyphenyl compound containing the bridge bond with a halogenating agent to generate a halogenated polyphenyl containing the bridge bond; and reacting the halogenated polyphenyl with a functional substance to generate the carrier transport unit having an aromatic nitrogen structure or an aromatic sulfur structure. At least one end of the carrier transport unit has a halogen atom.

In some embodiments, the step of reacting the hydrophobic unit with the carrier transport unit to generate the polymer includes:

linking the carrier transport unit and the hydrophobic unit by using a polyhydric alcohol, introducing the first ligand onto the hydrophobic structure of the obtained linking compound, introducing an alkyl chain onto the aromatic nitrogen structure or the aromatic sulfur structure in the carrier transport structure of the linking compound, and introducing a substituent group advantageous to coupling polymerization onto an aromatic-ring unoccupied carbon position of the aromatic nitrogen structure or the aromatic sulfur structure to generate a first reactive monomer;

reacting the substituent group in the first reactive monomer by using boron grease to generate a second reactive monomer; and reacting the first reactive monomer with the second reactive monomer to generate the polymer.

In some embodiments, the halogenating agent is a chlorinating agent, a brominating agent, or an iodinating agent. The polyphenyl compound is a diphenyl compound. The carrier transport unit is a compound having a triphenylamine based structure, a carbazole based structure, or a thiophene based structure. The polyhydric alcohol is a dihydric alcohol. The hydrophobic unit is a compound having a perfluoroaromatic structure. The first ligand is an amino ligand. The alkyl chain is an alkyl group whose number of carbon atoms is 2-8. The substituent group is chlorine, bromine, iodine or boron grease.

In another aspect, there is further provided an application of the above polymer, wherein the polymer is applied to preparation of a ligand material having a carrier transport function.

In still another aspect, there is further provided a quantum dots film layer, which includes a quantum dot particle and a carrier transport monomer. The carrier transport monomer coats the surface of the quantum dot particle, and the carrier transport monomer is generated after the polymer coating the surface of the quantum dot particle is broken at a bridge bond. The polymer includes a plurality of polymerized units, each of the polymerized units includes a hydrophobic structure and a carrier transport structure, wherein the hydrophobic structure is linked to the carrier transport structure via a bridge bond containing a functional atom. The hydrophobic structure is provided with a first ligand. When the polymerized unit is broken at the bridge bond, a hydrophobic monomer containing the first ligand and the carrier transport monomer containing a second ligand are generated. The second ligand includes the functional atom, and the second ligand is stronger than the first ligand in coordination activity.

In some embodiments, the functional atom is a sulfur atom. The first ligand is an amino ligand containing an amino group, and the second ligand is a mercapto ligand containing a mercapto group.

In some embodiments, the amino ligand is a primary amine based ligand, a secondary amine based ligand, or a tertiary amine based ligand.

In some embodiments, the bridge bond containing a functional atom is a disulphide ether bond, a thioether bond, or a thioester bond.

In some embodiments, the hydrophobic structure is a polyfluorinated aromatic structure.

In some embodiments, the polyfluorinated aromatic structure is a polyfluorobenzene structure, a polyfluorobiphenyl structure, or a hexafluorobiphenol A structure with a carbon position substituted.

In some embodiments, the carrier transport structure is a triphenylamine based structure, a carbazole based structure, or a thiophene based structure.

In still another aspect, there is further provided a method for preparing the quantum dots film layer, wherein the method includes:

performing coordination substitution on a quantum dots raw material by using a polymer, and coating the polymer on the surface of the quantum dot particle of the quantum dots raw material to obtain a polymer ligand quantum dot, wherein the first ligand in the hydrophobic structure of the polymer is stronger, in coordination activity, than an original ligand on the quantum dot particle of the quantum dots raw material; and forming a quantum dots film layer crude product by using the polymer ligand quantum dot; and reducing the quantum dots film layer crude product by using a reducing agent, such that a bridge bond in a polymerized unit of the polymer is broken, and a generated carrier transport monomer coats the surface of the quantum dot particle after the coordination substitution to generate the quantum dots film layer.

In some embodiments, the reducing agent includes a reductant, a hydrophobic solvent, and a hydrophilic solvent.

In some embodiments, when the bridge bond is a bridge bond containing a sulfur atom, the first ligand is an amino ligand containing an amino group and the second ligand is a mercapto ligand containing a mercapto group, the reductant includes at least one of sodium borohydride and lithium aluminium hydride. The hydrophobic solvent includes at least one of hexane, heptane, tetradecane, hexadecane, methylbenzene and chlorobenzene. The hydrophilic solvent includes at least one of ethanol, methanol, isopropanol and n-butyl alcohol.

DETAILED DESCRIPTION

Figure 1:
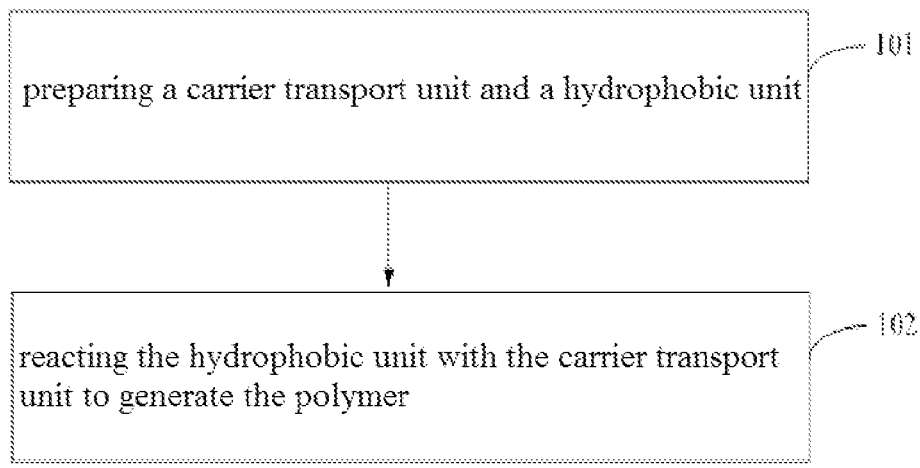
FIG. 1 is a flowchart of a method for preparing a polymer according to an embodiment of the present disclosure.

To make the foregoing objectives, features, and advantages of the present disclosure more apparent and lucid, the present disclosure is further described in detail below with reference to the accompanying drawings and embodiments.

In the description of the present disclosure, unless otherwise stated, the term "a plurality of" means two or more than two; and the orientation or position relations represented by the terms of "above", "beneath", "left", "right", "inside", "outside" and the like are orientation or position relations shown based on the accompanying figures, they are merely for ease of a description of the present disclosure and a simplified description instead of being intended to indicate or imply the device or element to have a special orientation or to be configured and operated in a special orientation. Thus, they cannot be understood as limiting of the present disclosure.

In the description of the present disclosure, it is to be noted that unless explicitly specified or limited otherwise, terms "installation", "connecting" or "connection" should be understood in a broad sense, which may be, for example, a fixed connection, a detachable connection or integrated connection, a mechanical connection or an electrical connection, a direct connection or indirect connection by means of an intermediary. For those of ordinary skill in the art, specific meanings of the above terms in the present disclosure may be understood based on specific circumstances.

In the following, specific implementations of the present disclosure are further described in detail with reference to the accompanying drawings and embodiments. The following embodiments are intended to describe the present disclosure but are not intended to limit the scope of the present disclosure.

An embodiment of the present disclosure provides a polymer, which includes a plurality of polymerized units. Each of the polymerized units includes a hydrophobic structure and a carrier transport structure. The hydrophobic structure is linked to the carrier transport structure via a bridge bond containing a functional atom, and the hydrophobic structure is provided with a first ligand. Block structures of the polymer include a hydrophobic structure-a carrier transport structure-a hydrophobic structure-a carrier transport structure.

When the polymerized unit is broken at the bridge bond, a hydrophobic monomer containing the first ligand and a carrier transport monomer containing a second ligand are generated. The second ligand includes the functional atom, and the second ligand is stronger than the first ligand in coordination activity.

In the polymer provided by the embodiments of the present disclosure, specific structures of the first ligand and the second ligand may be set based on actual situations. For example, the first ligand may be an amino ligand (—NH$_2$) containing an amino group, and the second ligand may be a mercapto ligand (—SH) containing a mercapto group. The second ligand includes the functional atom. Therefore, different second ligands correspond to different functional atoms. For example, when the second ligand is a mercapto ligand, the corresponding functional atom is a sulfur atom. The hydrophobic structure and the carrier transport structure in the polymerized unit are linked via a bridge bond containing the sulfur atom.

Specifically, when the first ligand is the amino ligand, the amino ligand may be a primary amine based ligand, a secondary amine based ligand, or a tertiary amine based ligand. When the second ligand is the mercapto ligand, the functional atom is a sulfur atom. The bridge bond containing the functional atom may be a disulphide ether bond, a thioether bond, or a thioester bond.

In the polymer provided by the embodiments of the present disclosure, specific forms of the hydrophobic structure and the carrier transport structure may be set based on actual situations. For example, the hydrophobic structure may be a polyfluorinated aromatic structure. The polyfluorinated aromatic structure may include a variety of specific structures such as a polyfluorobenzene structure, a polyfluorobiphenyl structure, or a hexafluorobiphenol A structure with a carbon position substituted, specifically for example, a substituted hexafluorobenzene structure, or a substituted decafluorobiphenyl structure. For the polyfluorobenzene structure or the polyfluorobiphenyl structure, a fluorine atom on the original benzene ring is substituted, and the first ligand is indirectly or directly grafted onto the carbon position of the benzene ring. For the hexafluorobiphenol A structure with a carbon position substituted, the first ligand may be indirectly or directly grafted onto the carbon position of the benzene ring through related reactions. The carrier transport structure may include a variety of specific structures such as a triphenylamine based structure, a carbazole based structure, or a thiophene based structure, specifically for example, TPD (N,N'-diphenyl-N,N'-di(3-methylphenyl)-1,1'-biphenyl-4,4'-diamine), TCTA (4,4',4"-tri (carbazole-9-yl) triphenylamine), NPB (N,N'-diphenyl-N,N'-(1-naphthyl)-1,1'-biphenyl-4,4'-di amine).

Exemplarily, when the hydrophobic structure is the substituted decafluorobiphenyl structure, the first ligand of the hydrophobic structure is the amino ligand, the bridge bond containing a functional atom is a disulphide ether bond, and the carrier transport structure is the triphenylamine structure, the structure of the corresponding polymer is shown as below:

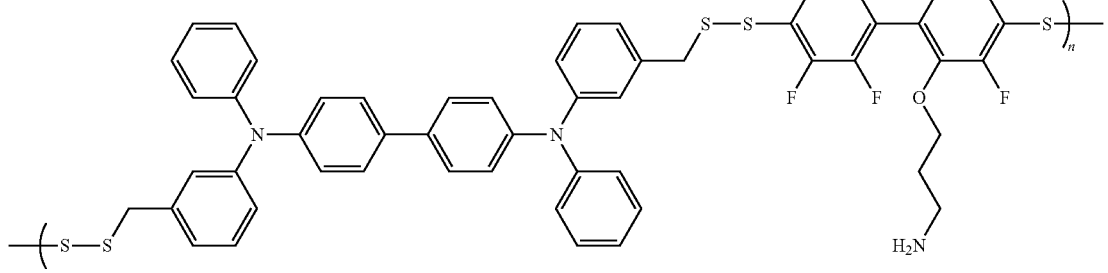

The polymer provided by this example may coat on the surface of the quantum dot particle (i.e., the quantum dot nuclear surface) by means of the amino ligand of the hydrophobic structure. Presence of the hydrophobic structure provides a hydrophobic performance for the polymer. Therefore, the polymer may provide a hydrophobic protection for the encapsulated quantum dot particle, and thus it is ensured the display performance security of the formed quantum dots. When the polymer is reduced by using a reducing agent, the disulphide ether bond in the polymer is broken, and a carrier transport monomer having an —SH ligand and a hydrophobic monomer having an —NH$_2$ ligand are generated. The —SH ligand is stronger than the —NH$_2$ ligand in coordination activity. Therefore, after the coordination substitution, the carrier transport unit having the —SH ligand coats the surface of the quantum dot particle to form quantum dots or a quantum dots film layer having a strong carrier transport performance.

In the polymer provided by the embodiments of the present disclosure, the second ligand is stronger than the first ligand in coordination activity. Therefore, when the polymer is broken at the bridge bond, a carrier transport monomer having a stronger coordination activity may be generated. The second ligand of the carrier transport monomer is stronger than the first ligand of the polymer in coordination activity. Therefore, the carrier transport monomer performs coordination substitution on the polymer coating the surface of a target substance. In this way, a ligand material having a strong carrier transport function may be obtained. When the target substance is a quantum dot particle, a quantum dots ligand material having a strong carrier transport function may be obtained by using the polymer provided by the embodiments of the present disclosure. In this way, electroluminescent properties of the quantum dots are enhanced, and the display performance of a display device such as a QLED device is improved. Therefore, the polymer provided by the embodiments of the present disclosure may be used for preparing a ligand material having a strong carrier transport function.

The polymer provided by the embodiments of the present disclosure has smaller size of nanometer scale, and may coat the surface of a nanometer particle such as a nanometer quantum dot particle. The hydrophobic structure of the polymer may provide a hydrophobic protection for the encapsulated quantum dot particle. Therefore, the quantum dot particle coated with the polymer can maintain better performance in a storage procedure, and the quantum dots film layer prepared by using the quantum dot particle coated with the polymer has better performance.

An embodiment of the present disclosure further provides a method for preparing the polymer. FIG. 1 is a flowchart of a method for preparing the polymer according to an embodiment of the present disclosure. As shown in FIG. 1, the preparation method includes following steps.

In Step 101, a carrier transport unit and a hydrophobic unit are prepared.

In Step 102, the carrier transport unit is reacted with the hydrophobic unit to generate the polymer.

The generated polymer includes a plurality of polymerized units, and each of the polymerized units includes a hydrophobic structure and a carrier transport structure. The hydrophobic structure is linked to the carrier transport structure via a bridge bond containing a functional atom, and the hydrophobic structure is provided with a first ligand. When the polymerized unit is broken at the bridge bond, a hydrophobic monomer containing the first ligand and a carrier transport monomer containing a second ligand are generated. The second ligand includes the functional atom, and the second ligand is stronger than the first ligand in coordination activity.

The step of preparing a carrier transport unit may include:
substituting a polyphenyl compound containing the bridge bond with a halogenating agent to generate a halogenated polyphenyl containing the bridge bond; and
reacting the halogenated polyphenyl with a functional substance to generate the carrier transport unit having an aromatic nitrogen structure or an aromatic sulfur structure, wherein at least one end of the carrier transport unit has a halogen atom.

Further, the step of reacting the hydrophobic unit with the carrier transport unit to generate the polymer may include:
linking the carrier transport unit and the hydrophobic unit by using a polyhydric alcohol, introducing the first ligand onto the hydrophobic structure of the obtained linking compound, introducing an alkyl chain onto the aromatic nitrogen structure or the aromatic sulfur structure in the carrier transport structure of the linking compound, and introducing a substituent group advantageous to coupling polymerization onto an aromatic-ring unoccupied carbon position of the aromatic nitrogen structure or the aromatic sulfur structure to generate a first reactive monomer;
reacting the substituent group in the first reactive monomer by using boron grease to generate a second reactive monomer; and
reacting the first reactive monomer with the second reactive monomer to generate the polymer.

In the method for preparing the polymer provided by the embodiments of the present disclosure, a variety of reagents may be selected based on actual situations. Specifically, the halogenating agent may be a chlorinating agent, a brominating agent, or an iodinating agent. The polyphenyl compound may be a diphenyl compound. The carrier transport unit may be a compound having a triphenylamine based structure, a carbazole based structure, or a thiophene based structure. The polyhydric alcohol may be a dihydric alcohol. The hydrophobic unit may be a compound having a perfluoroaromatic structure. The first ligand may be an amino ligand. The alkyl chain may be an alkyl group whose number of carbon atoms is 2-8. The substituent group may be chlorine, bromine, iodine or boron grease.

The polymer provided by the embodiments of the present disclosure may be prepared by using the preparation method provided by the embodiments of the present disclosure. The polymer has many advantages and properties. Reference may be made to the foregoing description for the polymer, which is not repeated any more herein.

Figure 2A:
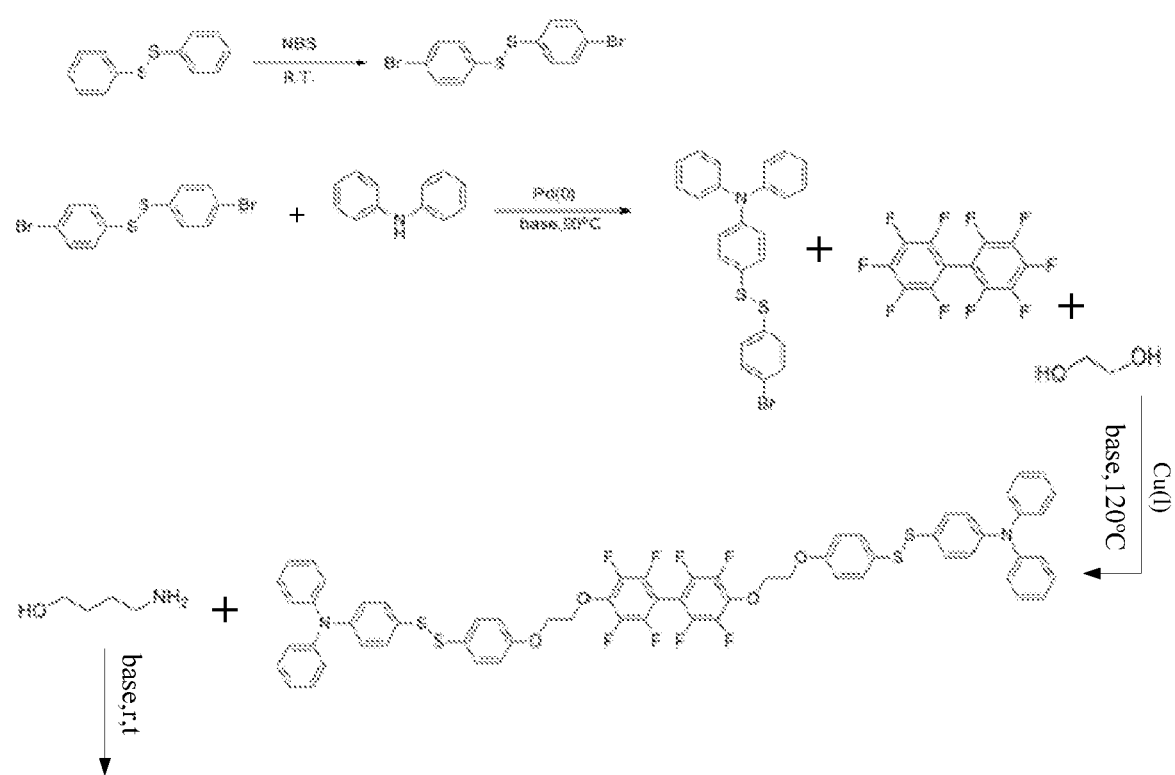
FIGS. 2A and B are schematic diagrams of a method for preparing a polymer according to an embodiment of the present disclosure.
Figure 2B:
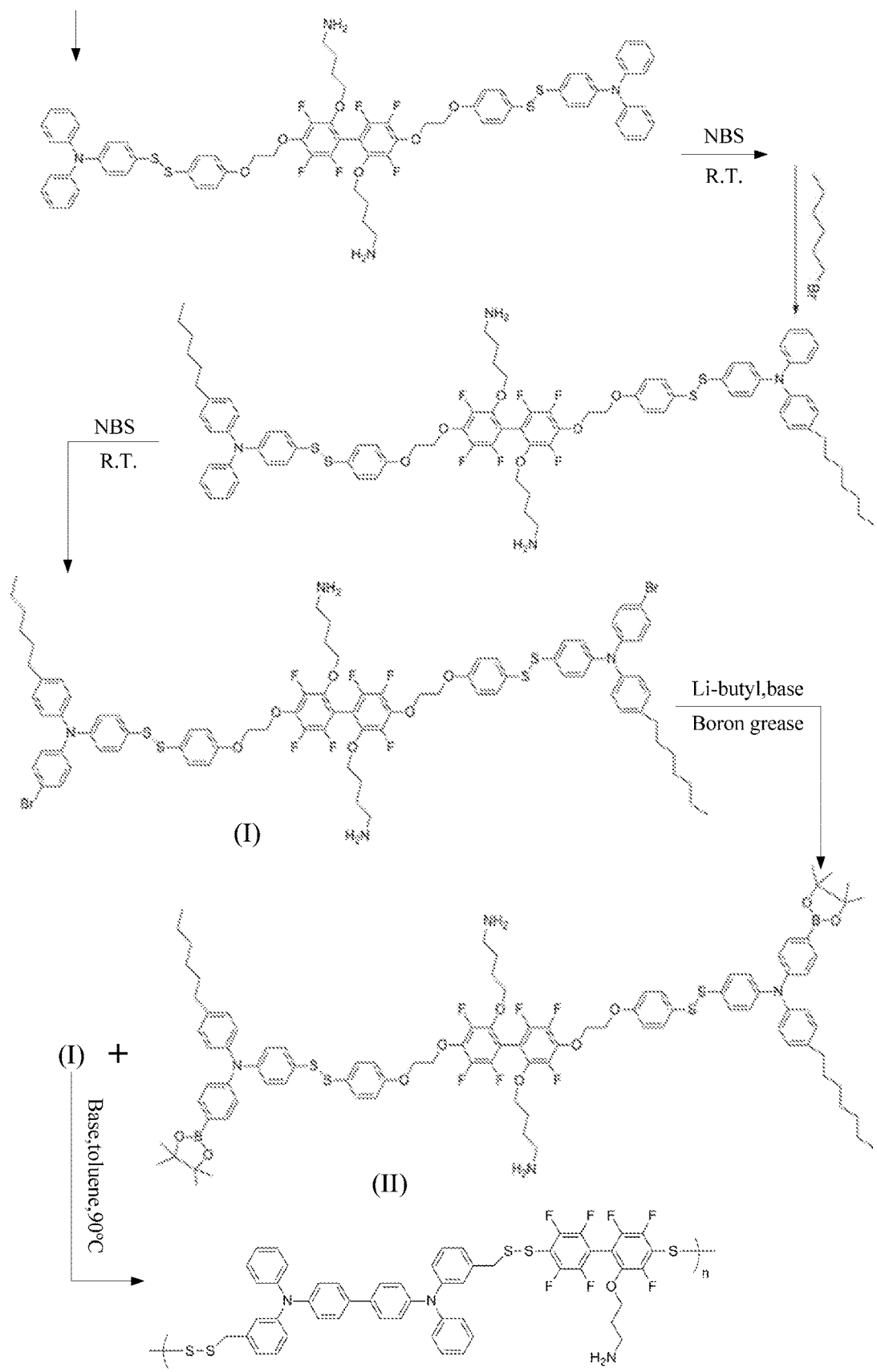

Exemplarily, an embodiment of the present disclosure provides a method for preparing a polymer, wherein the structure of the polymer is as shown in the example of the polymer, and the preparation method is as shown in FIG. 2A and continued in FIG. 2B.

Based on the above characteristics of the polymer provided by the embodiments of the present disclosure, the polymer provided by the embodiments of the present disclosure may be employed to prepare a quantum dots film layer. The prepared quantum dots film layer includes a quantum dot particle and a carrier transport monomer. The carrier transport monomer coats the surface of the quantum dot particle, and the carrier transport monomer is generated after the polymer provided by the embodiments of the present disclosure coats the surface of the quantum dot particle is broken at the bridge bond. Reference may be made to the description of the polymer provided by the embodiments of the present disclosure for related structures such as the structure of the carrier transport unit, the structure of the polymer and the structure of the bridge bond, which are not repeated any more herein.

The hydrophobic structure of the polymer may provide a hydrophobic protection for the encapsulated quantum dot particle. Therefore, the quantum dot particle coated with the polymer can maintain better performance in a storage procedure, and the quantum dots film layer prepared by using the quantum dot particle coated with the polymer has better display performance.

Figure 3:
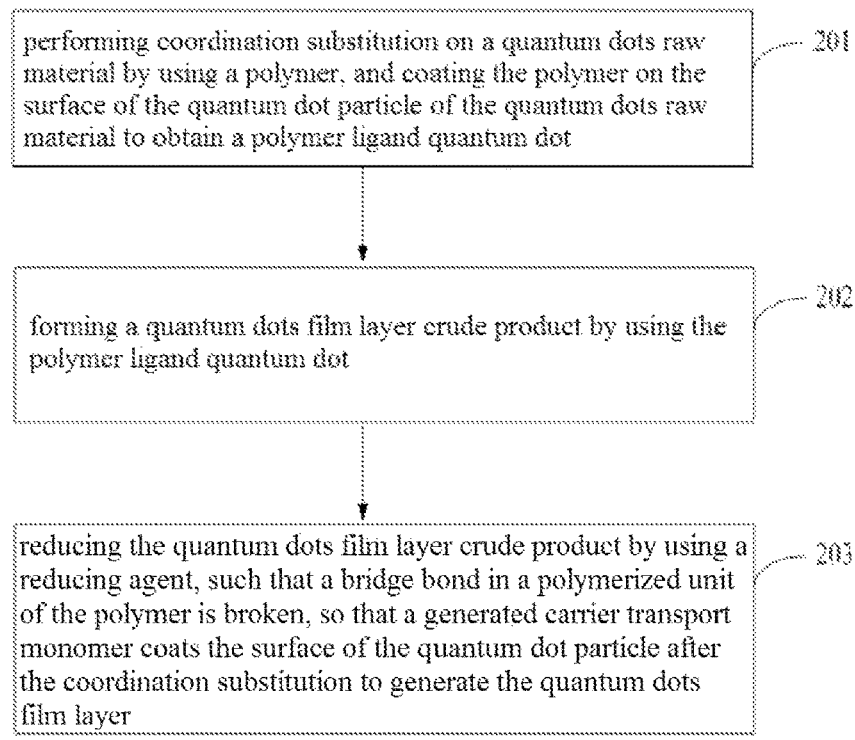
FIG. 3 is a flowchart of a method for preparing a quantum dots film layer according to an embodiment of the present disclosure.

FIG. 3 is a flowchart of a method for preparing a quantum dots film layer according to an embodiment of the present disclosure. Referring to FIG. 3, the method for preparing a quantum dots film layer may include following steps.

In Step 201, coordination substitution is performed on a quantum dots raw material by using a polymer, and the polymer is coated on the surface of the quantum dot particle of the quantum dots raw material to obtain a polymer ligand quantum dot.

The quantum dots raw material includes quantum dot particle and an original ligand, wherein the original ligand coats the surface of the quantum dot particle. As mentioned in the background art, the original ligand typically is a long-chain oily ligand such as oleic acid.

The first ligand in the hydrophobic structure of the polymer is stronger, in coordination activity, than the original ligand on the quantum dot particle in the quantum dots raw material. Coordination substitution is performed on the original ligand in the quantum dots raw material by using the polymer, such that the polymer is coated on the surface of the quantum dot particle by means of the first ligand.

Based on the above principles, types of the first ligand and the original ligand may be selected based on actual situations.

In the prepared polymer ligand quantum dots, the polymer coats the surface of the quantum dot particle and the polymer has the hydrophobic structure. Therefore, the polymer has a waterproof effect on the quantum dot particle, such that the polymer ligand quantum dots have better waterproof performance, thereby guaranteeing luminescent properties of the quantum dot particle.

In Step 202, a quantum dots film layer crude product is formed by using the polymer ligand quantum dot.

The quantum dots film layer crude product is obtained by using the polymer ligand quantum dot prepared in Step 201. The process of preparing the quantum dots film layer by using the quantum dots is an existing process, and parameters of the process may be appropriately adjusted based on properties of materials provided by the embodiments of the present disclosure, which is not repeated any more herein.

In Step 203, the quantum dots film layer crude product is reduced by using a reducing agent, such that a bridge bond in a polymerized unit of the polymer is broken, and a generated carrier transport monomer coats the surface of the quantum dot particle after the coordination substitution to generate the quantum dots film layer.

The polymer is processed by using a reducing agent, such that a hydrophobic monomer containing the first ligand and a carrier transport monomer containing a second ligand are generated after the polymer is broken at the bridge bond. The second ligand is stronger than the first ligand in coordination activity. The carrier transport monomer moves to the surface of the quantum dot particle. The second ligand of the carrier transport monomer is stronger, in coordination activity, than the first ligand of the polymer coating the surface of the quantum dot particle. Therefore, the carrier transport monomer performs coordination substitution on the polymer, such that the carrier transport monomer coats the surface of the quantum dot particle by means of the second ligand to generate the quantum dots film layer.

In the quantum dots film layer, the carrier transport monomer having a strong carrier transport performance coats the surface of the quantum dot particle. Therefore, the quantum dots film layer has a strong carrier transport function, and a display device prepared by using the quantum dots film layer has better electroluminescent display performance.

In the embodiments of the present disclosure, the used quantum dot particle includes but is not limited to: CdS, CdSe, ZnSe, InP, PbS, $CsPbCl_3$, $CsPbBr_3$, $CsPhI_3$, CdS/ZnS, CdSe/ZnS, ZnSe, InP/ZnS, PbS/ZnS, $CsPbCl_3$/ZnS, $CsPbBr_3$/ZnS and $CsPhI_3$/ZnS, etc.

Types of the reducing agent may be selected based on actual situations. For example, the reducing agent may include a reductant, a hydrophobic solvent, and a hydrophilic solvent. Specifically, when the bridge bond is a bridge bond containing a sulfur atom, the first ligand is an amino ligand containing an amino group, and the second ligand is a mercapto ligand containing a mercapto group, the reductant may include at least one of sodium borohydride and lithium aluminium hydride; the hydrophobic solvent may include at least one of hexane, heptane, tetradecane, hexadecane, methylbenzene and chlorobenzene; the hydrophilic solvent may include at least one of ethanol, methanol, isopropanol and n-butyl alcohol. Adding the hydrophobic solvent into the reducing agent may infiltrate the surface of the quantum dots film layer crude product. However, the proportion of usage of the hydrophobic solvent and the hydrophilic solvent needs to be controlled to ensure that the quantum dots in the film layer are not obviously dissolved by the solvents.

Figure 4:
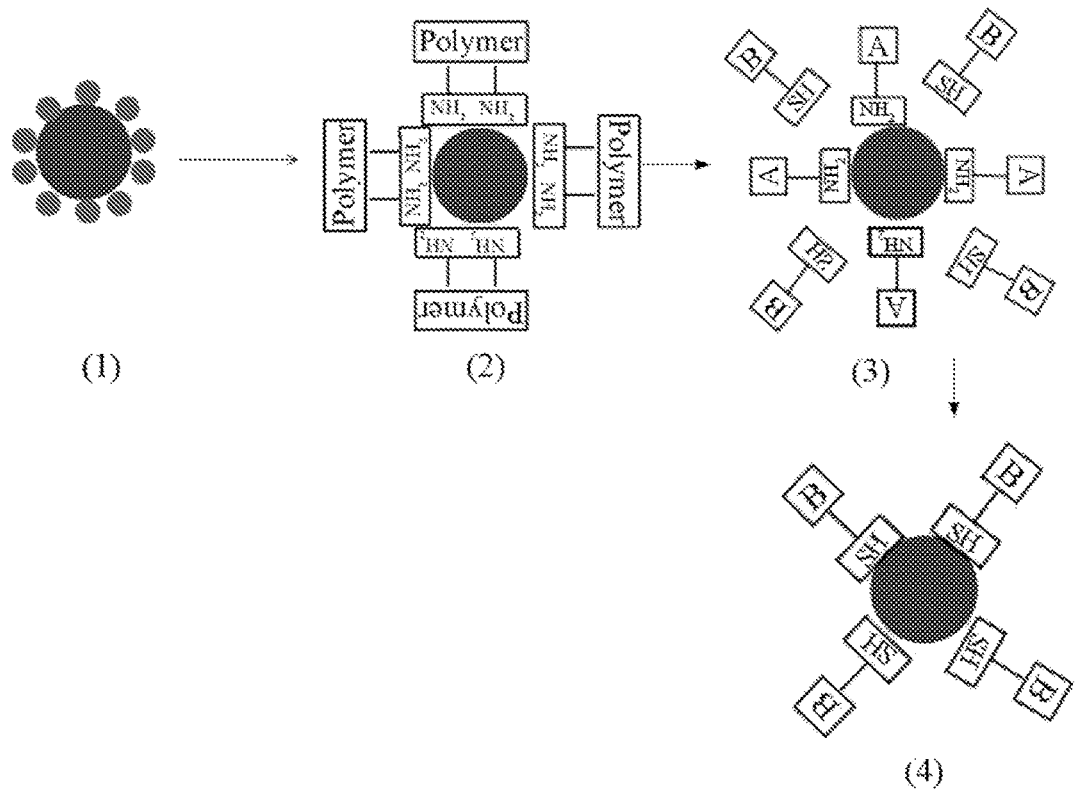
FIG. 4 is a schematic diagram of a method for preparing a quantum dots film layer according to an embodiment of the present disclosure.

Exemplarily, FIG. 4 is a schematic diagram of a method for preparing a quantum dots film layer according to an embodiment of the present disclosure. With reference to FIG. 4, the method for preparing a quantum dots film layer according to the embodiment of the present disclosure is as below.

The structure (1) in FIG. 4 is the quantum dots raw material, which includes the quantum dots particle and the original ligand. A central nuclear body in the structure (1) represents the quantum dots particle, and small-sized particles coating the surface of the central nuclear body represent the original ligands. In this example, the quantum dots raw material is prepared by using a high-temperature oil phase method. In the quantum dots raw material, specific composition of the quantum dots particle is CdSe/ZnS. The original ligand is an oleic acid ligand.

The polymer includes a plurality of polymerized units. The strong hydrophobic structure A in a polymerized unit is polyfluorobiphenyl (substituted decafluorobiphenyl), the first ligand is an amino ligand —$NH_2$, the strong carrier transport structure B is a TPD reagent, and the bridge bond is a disulphide ether bond.

The quantum dots raw material (1 equivalent) and the polymer (100 equivalents) as shown in the structure (1) are dissolved in methylbenzene for coordination substitution. After the coordination substitution is completed, DMF (N,N-dimethyl formamide) is added to precipitate the quantum dots out. The precipitated quantum dots are rinsed and dried for standby use. In this way, the polymer ligand quantum dot is obtained, and the structure thereof is as shown in a structure (2) of a structural diagram 4.

In the process of fabricating a device, a quantum dots film layer crude product is prepared by using the polymer ligand quantum dot as shown in the structure (2), next sodium borohydride (100 equivalents) is dissolved into a mixed solvent. The mixed solvent includes hexane and methanol with a mole ratio of 1:8. The mixed solvent is dripped onto the surface of the quantum dots film layer crude product and is infiltrated into the film layer such that the disulphide bridge bond is broken to form a mercaptan monomer, whose structure is as shown in the structure (3) in FIG. 4. Further, the mercaptan monomer coats the surface of the quantum dot particle through the coordination substitution to form a new ligand quantum dots material advantageous to carrier transport, whose structure is as shown in the structure (4) in FIG. 4. Finally, small molecules in the film layer and the participant solvents are rinsed by using methanol and then are subject to annealing treatment to obtain the quantum dots film layer.

The quantum dots film layer prepared by using the method in this example has a strong carrier transport function.

The embodiments in the specification are described in a progressive manner. Each embodiment is focused on difference from other embodiments. And cross reference is available for identical or similar parts among different embodiments.

The polymer, the quantum dots film layer and the preparation method thereof provided by the present disclosure are described in detail above, elaboration of principles and implementations of the present disclosure is made by using specific examples herein, and the description of the foregoing embodiments is merely intended to assist in understanding the method of the present disclosure and the core concept thereof. Also, those of ordinary skill in the art may change, in accordance with the concept of the present disclosure, a concrete implementation and a scope of application. In conclusion, contents of the specification shall be not interpreted as limiting the present disclosure.

What is claimed is:

1. A polymer, comprising a plurality of polymerized units, each of the polymerized units comprising a hydrophobic structure and a carrier transport structure, wherein the hydrophobic structure is linked to the carrier transport structure via a bridge bond containing a functional atom;

the hydrophobic structure is provided with a first ligand; and when the polymerized unit is broken at the bridge bond, a hydrophobic monomer containing the first ligand and a carrier transport monomer containing a second ligand are generated, wherein the second ligand comprises the functional atom, and the second ligand is stronger than the first ligand in coordination activity.

2. The polymer according to claim 1, wherein the functional atom is a sulfur atom;
   the first ligand is an amino ligand containing an amino group; and
   the second ligand is a mercapto ligand containing a mercapto group.

3. The polymer according to claim 2, wherein the amino ligand is a primary amine based ligand, a secondary amine based ligand, or a tertiary amine based ligand.

4. The polymer according to claim 2, wherein the bridge bond containing a functional atom is a disulphide ether bond, a thioether bond, or a thioester bond.

5. The polymer according to claim 1, wherein the hydrophobic structure is a polyfluorinated aromatic structure.

6. The polymer according to claim 5, wherein the polyfluorinated aromatic structure is a polyfluorobenzene structure, a polyfluorobiphenyl structure, or a hexafluorobiphenol A structure with a carbon position substituted.

7. The polymer according to claim 1, wherein the carrier transport structure is a triphenylamine based structure, a carbazole based structure, or a thiophene based structure.

8. A method for preparing a polymer, comprising:
   preparing a carrier transport unit and a hydrophobic unit; and
   reacting the hydrophobic unit with the carrier transport unit to generate the polymer;
   wherein the polymer comprises a plurality of polymerized units, each of the polymerized units comprises a hydrophobic structure and a carrier transport structure, the hydrophobic structure is linked to the carrier transport structure via a bridge bond containing a functional atom, the hydrophobic structure is provided with a first ligand, when the polymerized unit is broken at the bridge bond, a hydrophobic monomer containing the first ligand and a carrier transport monomer containing a second ligand are generated, the second ligand comprises the functional atom, and the second ligand is stronger than the first ligand in coordination activity.

9. The method according to claim 8, wherein the step of preparing a carrier transport unit comprises:
   substituting a polyphenyl compound containing the bridge bond with a halogenating agent to generate a halogenated polyphenyl containing the bridge bond; and
   reacting the halogenated polyphenyl with a functional substance to generate the carrier transport unit having an aromatic nitrogen structure or an aromatic sulfur structure, at least one end of the carrier transport unit having a halogen atom.

10. The method according to claim 9, wherein the step of reacting the hydrophobic unit with the carrier transport unit to generate the polymer comprises:
    linking the carrier transport unit and the hydrophobic unit by using a polyhydric alcohol, introducing the first ligand onto the hydrophobic structure of the obtained linking compound, introducing an alkyl chain onto the aromatic nitrogen structure or the aromatic sulfur structure in the carrier transport structure of the linking compound, and introducing a substituent group advantageous to coupling polymerization onto an aromatic-ring unoccupied carbon position of the aromatic nitrogen structure or the aromatic sulfur structure to generate a first reactive monomer;
    reacting the substituent group in the first reactive monomer by using boron grease to generate a second reactive monomer; and
    reacting the first reactive monomer with the second reactive monomer to generate the polymer.

11. The method according to claim 10, wherein the halogenating agent is a chlorinating agent, a brominating agent, or an iodinating agent;
    the polyphenyl compound is a diphenyl compound;
    the carrier transport unit is a compound having a triphenylamine based structure, a carbazole based structure, or a thiophene based structure;
    the polyhydric alcohol is a dihydric alcohol;
    the hydrophobic unit is a compound having a perfluoroaromatic structure;
    the first ligand is an amino ligand;
    the alkyl chain is an alkyl group whose number of carbon atoms is 2-8; and
    the substituent group is chlorine, bromine, iodine or boron grease.

12. An application of the polymer according to claim 1, wherein the polymer is applied to preparation of a ligand material having a carrier transport function.

13. A quantum dots film layer, comprising a quantum dot particle and a carrier transport monomer, wherein the carrier transport monomer coats a surface of the quantum dot particle, and the carrier transport monomer is generated after the polymer coating the surface of the quantum dot particle is broken at a bridge bond;
    the polymer comprises a plurality of polymerized units, each of the polymerized units comprises a hydrophobic structure and a carrier transport structure, wherein the hydrophobic structure is linked to the carrier transport structure via the bridge bond containing a functional atom;
    the hydrophobic structure is provided with a first ligand; and
    when the polymerized unit is broken at the bridge bond, a hydrophobic monomer containing the first ligand and the carrier transport monomer containing a second ligand are generated, wherein the second ligand comprises the functional atom, and the second ligand is stronger than the first ligand in coordination activity.

14. The quantum dots film layer according to claim 13, wherein the functional atom is a sulfur atom;
    the first ligand is an amino ligand containing an amino group; and
    the second ligand is a mercapto ligand containing a mercapto group.

15. The quantum dots film layer according to claim 14, wherein the amino ligand is a primary amine based ligand, a secondary amine based ligand, or a tertiary amine based ligand.

16. The quantum dots film layer according to claim 14, wherein the bridge bond containing a functional atom is a disulphide ether bond, a thioether bond, or a thioester bond.

17. The quantum dots film layer according to claim 13, wherein the hydrophobic structure is a polyfluorinated aromatic structure.

18. The quantum dots film layer according to claim 17, wherein the polyfluorinated aromatic structure is a polyfluorobenzene structure, a polyfluorobiphenyl structure, or a hexafluorobiphenol A structure with a carbon position substituted.

19. The polymer according to claim 13, wherein the carrier transport structure is a triphenylamine based structure, a carbazole based structure, or a thiophene based structure.

20. A method for preparing the quantum dots film layer according to claim 13, comprising:
    performing coordination substitution on a quantum dots raw material by using a polymer, and coating the polymer on the surface of the quantum dot particle of the quantum dots raw material to obtain a polymer ligand quantum dot, the first ligand in the hydrophobic structure of the polymer being stronger, in coordination activity, than an original ligand on the quantum dot particle of the quantum dots raw material;
    forming a quantum dots film layer crude product by using the polymer ligand quantum dot; and
    reducing the quantum dots film layer crude product by using a reducing agent, such that a bridge bond in a polymerized unit of the polymer is broken, so that a generated carrier transport monomer coats the surface of the quantum dot particle after the coordination substitution to generate the quantum dots film layer.

* * * * *